United States Patent [19]
Kim

[11] Patent Number: 6,133,164
[45] Date of Patent: Oct. 17, 2000

[54] FABRICATION OF OXIDE REGIONS HAVING MULTIPLE THICKNESSES USING MINIMIZED NUMBER OF THERMAL CYCLES

[75] Inventor: Hyeon-Seag Kim, Sunnyvale, Calif.

[73] Assignee: Vantis Corporation, Sunnyvale, Calif.

[21] Appl. No.: 09/256,245

[22] Filed: Feb. 23, 1999

[51] Int. Cl.[7] .................................................. H01L 21/8234
[52] U.S. Cl. ........................................... 438/981; 438/275
[58] Field of Search ................................... 438/981, 255, 438/275, 787

[56] References Cited

U.S. PATENT DOCUMENTS

| | | | |
|---|---|---|---|
| 5,595,922 | 1/1997 | Tigelaar et al. | 438/275 |
| 5,861,347 | 1/1999 | Maiti et al. | 438/981 |
| 5,918,116 | 6/1999 | Chittipeddi | 438/981 |
| 5,920,779 | 7/1999 | Sun et al. | 438/981 |

OTHER PUBLICATIONS

C.T. Liu, E.J. Lloyd, Yi Ma, M. Du, R.L. Opila, and S.J. Hillenius, High Performance 0.2 μm CMOS with 25 Å Gate Oxide Grown on Nitrogen Implanted Si Substrates, IEDM, 1996 pp. 499–502.

Y.C. King, C. Kuo, T.J. King, and C. Hu, Sub–5nm Multiple–Thickness Gate Oxide Technology using Oxide Implantation, IEDM, 1998, pp. 585–588.

*Primary Examiner*—Charles Bowers
*Assistant Examiner*—David S Blum
*Attorney, Agent, or Firm*—Monica H. Choi

[57] ABSTRACT

The present invention is a method for fabricating a plurality of oxide regions having a plurality of thicknesses on a semiconductor wafer. The present invention includes a step of depositing a first masking layer on the semiconductor wafer, and the first masking layer defines at least one first region for oxide growth of a first thickness. The present invention also includes a step of implanting oxygen ions into the at least one first region such that the first thickness of oxide on the at least one first region is relatively thicker. The first masking layer is then removed from the semiconductor wafer. The present invention further includes a step of depositing a second masking layer on the semiconductor wafer, and the second masking layer defines at least one second region for oxide growth of a second thickness. The present invention also includes a step of implanting nitrogen ions into the at least one second region such that the second thickness of oxide on the at least one second region is relatively thinner. The second masking layer is then removed from the semiconductor wafer. The present invention further includes the step of growing oxide on the at least one first region to have the first thickness and on the at least one second region to have the second thickness with a thermal process for the semiconductor wafer. During the thermal process, at least one third region of oxide may be grown to have a third thickness which is thinner than the oxide on the at least one first region and that is thicker than the oxide on the at least one second region since the at least one third region has not been exposed to oxygen ion implantation nor to nitrogen ion implantation.

12 Claims, 8 Drawing Sheets

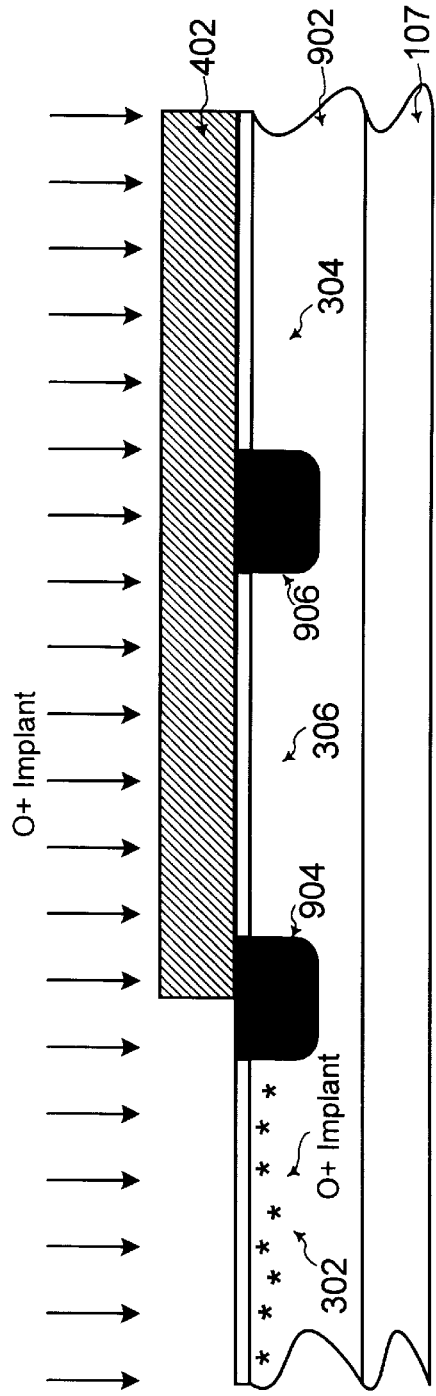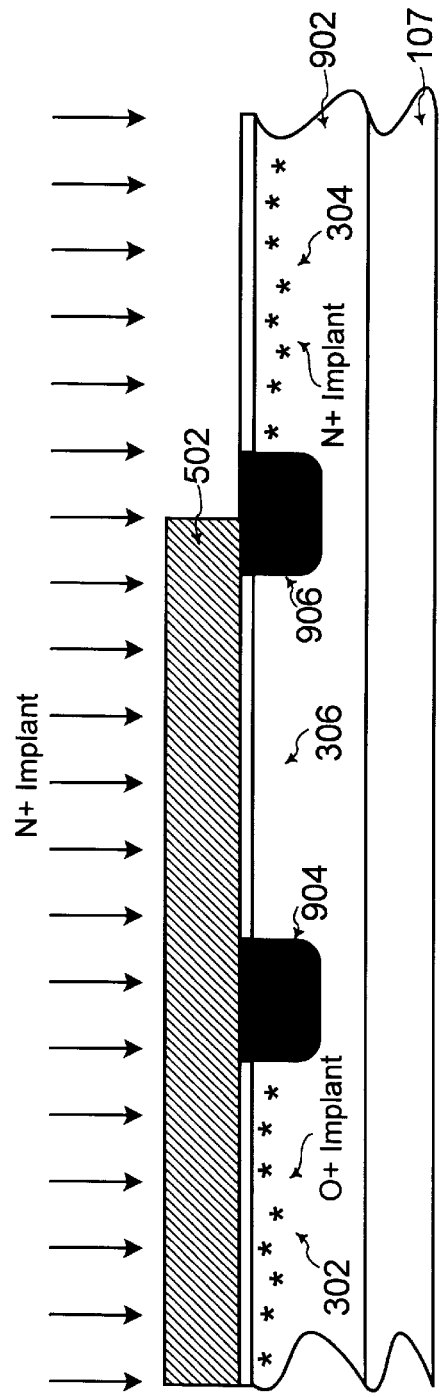

FABRICATION OF OXIDE REGIONS HAVING MULTIPLE THICKNESSES USING MINIMIZED NUMBER OF THERMAL CYCLES

TECHNICAL FIELD

This invention relates to growth of oxide regions during integrated circuit fabrication, and more particularly, to a method for growing oxide regions of a plurality of thicknesses on a semiconductor wafer using ion implantation such that the number of thermal cycles used for growing oxide regions of multiple thicknesses is minimized.

BACKGROUND OF THE INVENTION

The modern trend in integrated circuit fabrication is to combine logic circuits and various memory elements in one chip. Respective devices for each of the different circuits on one chip optimally operate at different voltages. In addition, an integrated circuit on one chip is designed to accommodate multiple supply voltages.

Referring to FIG. 1, a cross sectional view of different devices on an integrated circuit chip is shown. A first MOSFET (Metal Oxide Semiconductor Field Effect Transistor) 102, a second MOSFET (Metal Oxide Semiconductor Field Effect Transistor) 104, and a third MOSFET (Metal Oxide Semiconductor Field Effect Transistor) 108 are fabricated on a semiconductor wafer 107. The first MOSFET 102 is separated from the third MOSFET 106 by a first LOCOS (Local Oxidation on Substrate) region 108. The third MOSFET 106 is separated from the second MOSFET 104 by a second LOCOS (Local Oxidation on Substrate) region 110.

Referring to FIG. 2, a top view of the portion of the semiconductor wafer 107 holding the first MOSFET 102, the second MOSFET 104, and the third MOSFET 106 is shown. The cross sectional view of FIG. 1 is along a line A—A in the top view of FIG. 2.

The present invention is described with MOSFET (Metal Oxide Semiconductor Field Effect Transistor) devices having an oxide region as the gate terminal. However, the present invention may be applied to fabrication of any other type of device having an oxide region as part of that device.

Referring to FIG. 1, the first MOSFET 102 has a first oxide region 112 as the gate terminal of the first MOSFET 102, the second MOSFET 104 has a second oxide region 114 as the gate terminal of the second MOSFET 104, and the third MOSFET 106 has a third oxide region 116 as the gate terminal of the third MOSFET 106.

With the recent trend of combining logic circuits and various memory elements in one chip, different devices, such as MOSFETs, on a semiconductor wafer may be designed to operate with different voltages. Referring to FIG. 1, for example, a first thickness of the first oxide region 112 of the first MOSFET 102 is relatively thicker because the first MOSFET 102 is used to operate at a higher voltage. The first MOSFET 102 may be a high voltage MOSFET. A high voltage MOSFET is designed with a thicker gate oxide to resist voltage breakdown at high voltage operations.

A second thickness of the second oxide region 114 of the second MOSFET 104 is relatively thinner because the second MOSFET 104 is used to operate at lower voltage. The second MOSFET 104 may be a low voltage MOSFET. A low voltage MOSFET is designed with a thinner gate oxide to ensure that the low voltage MOSFET turns on even when a low voltage is applied on its gate terminal.

The third MOSFET 106 may be a tunnel device, and the third oxide region 116 in that case is amenable for the tunneling effect as known to one of ordinary skill in the art of transistor device design. In that case, the third thickness of the third oxide region 116 of the third MOSFET 106 is relatively thinner than the first thickness of the first oxide region 112 of the first MOSFET 102 but is relatively thicker than the second thickness of the second oxide region 114 of the second MOSFET 104.

With such diverse MOSFETs 102, 104, and 106 on one chip, a method for efficiently and effectively fabricating the oxide regions of various thicknesses is required. In the foreseeable future, the thickness of the thinnest oxide region on a semiconductor chip, for low voltage MOSFETs for example, may be just less than 30 Å (angstroms) while the thickness of the thickest oxide region on that semiconductor chip, for high voltage MOSFETs for example, may be just less than 200 Å (angstroms). In addition, intermediate thicknesses of devices, for tunnel MOSFETs for example, may be just less than 150 Å (angstroms).

In the prior art, nitrogen implantation alone has been used to vary the thickness of oxide growth as discussed in the journal article, High Performance 0.2 µm CMOS with 25 Å Gate Oxide Grown on Nitrogen Implanted Si Substrates, by C.T. Liu et al., IEDM, 1996, pgs. 499–502. Nitrogen implantation before a thermal process of oxide growth results in inhibition of oxide growth. A larger dosage of nitrogen implantation results in thinner oxide regions. However, nitrogen implantation alone has limitations in the range of dosage that may be used to result in useful oxide regions. With excessive nitrogen implantation, the semiconductor wafer is damaged. Thus, nitrogen implantation alone has limits in the oxide thickness range which may be achieved.

In addition, in the prior art, oxygen implantation alone has been used to vary the thickness of oxide growth as discussed in the journal article, Sub-5 nm Multiple Thickness Gate Oxide Technology Using Oxygen Implantation, by Ya-Chin King et al., IEDM, 1998, pgs. 585–588. Oxygen implantation before a thermal process of oxide growth results in promotion of oxide growth. A larger dosage of nitrogen implantation results in thicker oxide regions. However, oxygen implantation alone has limitations in the range of dosage that may be used to result in useful oxide regions. With excessive oxygen implantation, the semiconductor wafer is damaged. Thus, oxygen implantation alone has limits in the oxide thickness range which may be achieved.

With the recent trend of combining more numerous different circuits on one chip, a wider range of oxide thicknesses than effectively achievable with nitrogen implantation alone or with oxygen implantation alone is desired. In addition, an efficient process for oxide growth which uses a minimized number of thermal processes is desired. A minimized number of thermal processes is more cost effective, less time-consuming, and may result in better circuit performance of the integrated circuit.

SUMMARY OF THE INVENTION

Accordingly, the present invention is a method for growing oxide regions having a wide range of thicknesses on a semiconductor wafer using ion implantation such that the number of thermal cycles used for growing oxide regions of multiple thicknesses is minimized. The present invention results in growth of oxide regions having a wider range of thicknesses than heretofore achievable while at the same time using a minimum number of thermal cycles.

Generally, the present invention is a method for fabricating a plurality of oxide regions having a plurality of thicknesses on a semiconductor wafer. The present invention includes a step of depositing a first masking layer on the semiconductor wafer, and the first masking layer defines at least one first region for oxide growth of a first thickness. The present invention also includes a step of implanting oxygen ions into the at least one first region such that the first thickness of oxide on the at least one first region is relatively thicker. The first masking layer is then removed from the semiconductor wafer. The present invention further includes a step of depositing a second masking layer on the semiconductor wafer, and the second masking layer defines at least one second region for oxide growth of a second thickness. The present invention also includes a step of implanting nitrogen ions into the at least one second region such that the second thickness of oxide on the at least one second region is relatively thinner. The second masking layer is then removed from the semiconductor wafer. The present invention further includes the step of growing oxide on the at least one first region to have the first thickness and on the at least one second region to have the second thickness with a thermal process for the semiconductor wafer.

In addition, the present invention may further include a step of growing oxide on at least one third region having a third thickness on the semiconductor wafer during the thermal process. The at least one third region has not been implanted with oxygen ions and has not been implanted with nitrogen ions such that the third thickness of the oxide on the at least one third region is relatively less than the first thickness of the oxide on the at least one first region and relatively greater than the second thickness of the oxide on the at least one second region.

The present invention may be used to particular advantage when the at least one first region of oxide is part of a high voltage transistor, when the at least one second region of oxide is part of a low voltage transistor, and when the at least one third region of oxide is part of a tunnel transistor.

A dosage of the oxygen implantation may be increased for a larger first thickness of the oxide on the at least one first region, and a dosage of the nitrogen implantation may be increased for a smaller second thickness of the oxide on the at least one second region.

In this manner, by both implanting certain regions of the semiconductor wafer with nitrogen ions and implanting certain regions of the semiconductor wafer with oxygen ions before a thermal process for oxide growth, a wider range of oxide thicknesses on one semiconductor wafer may be achieved with a minimal number of thermal cycles.

These and other features and advantages of the present invention will be better understood by considering the following detailed description of the invention which is presented with the attached drawings.

BRIEF DESCRIPTION OF THE DRAWINGS

FIG. 13 shows a cross-section of a semiconductor wafer with shallow trench isolation technology and with a first masking layer such that one oxide region is exposed to oxygen ion implantation for thicker oxide growth, according to the present invention;

FIG. 14 shows the cross-section of FIG. 13 with a second masking layer such that another oxide region is exposed to nitrogen ion implantation for thinner oxide growth, according to the present invention;

Figure 1:
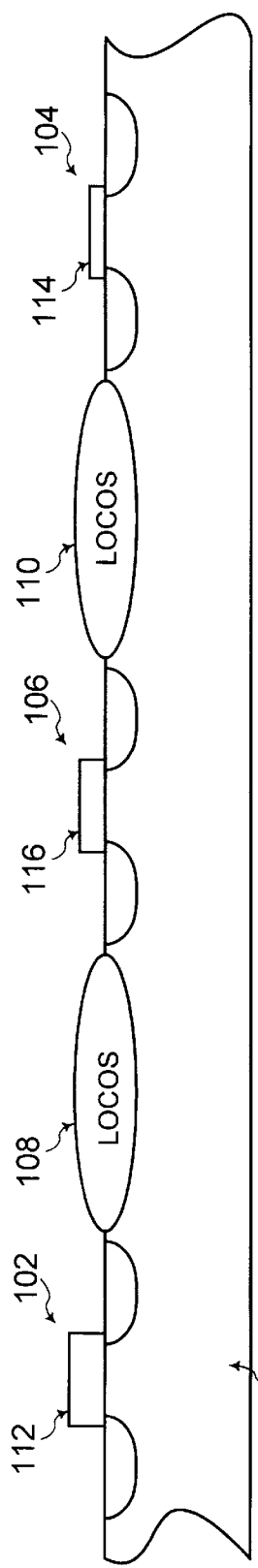
FIG. 1 shows a cross-section of three MOSFETs (Metal Oxide Semiconductor Field Effect Transistors) on one integrated circuit chip having gate oxides of different thicknesses.

The figures referred to herein are drawn for clarity of illustration and are not necessarily drawn to scale. Moreover, the figures referred to herein focus on a few oxide regions within a larger integrated circuit. Elements having the same reference numeral in FIGS. 1, 2, 3, 4, 5, 6, 7, 8, 9, 10, 11, 12, 13, 14, 15, and 16 refer to elements having similar structure and function.

DETAILED DESCRIPTION

The present invention is described with MOSFET (Metal Oxide Semiconductor Field Effect Transistor) devices having an oxide region as the gate terminal. However, the present invention may be applied for fabrication of any other type of device having an oxide region as part of that device.

Figure 2:
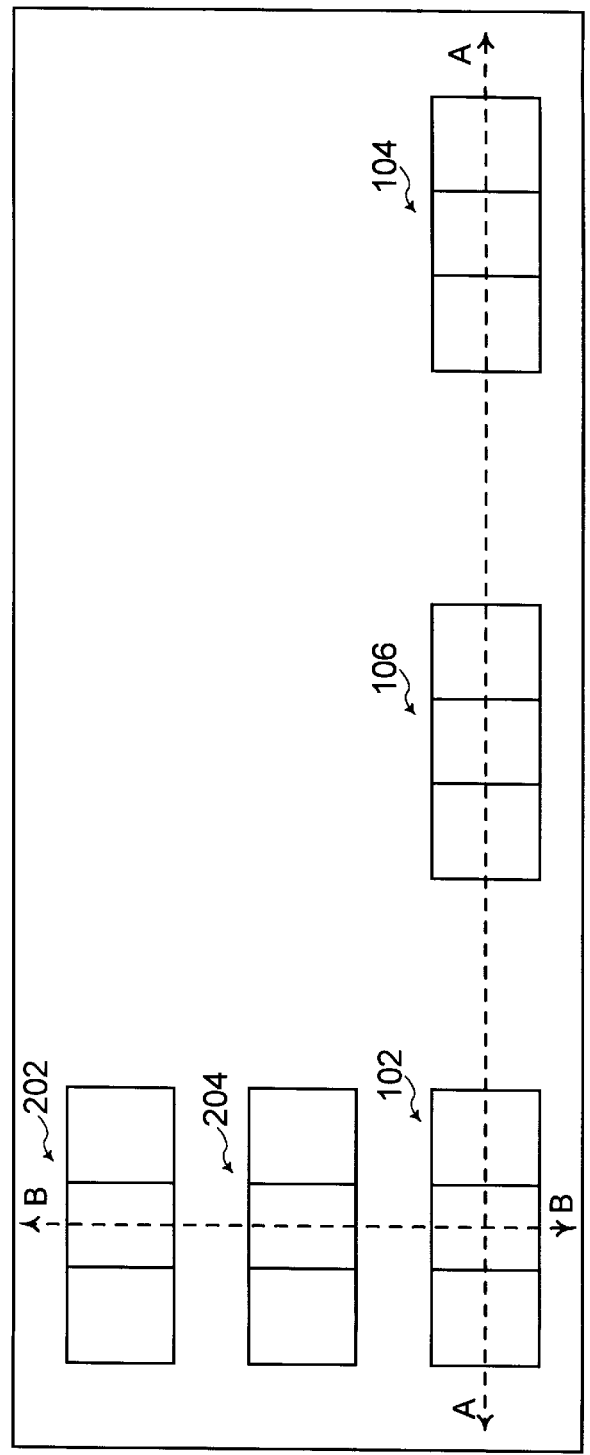
FIG. 2 shows a top view of the semiconductor wafer holding the three MOSFETs of FIG. 1.
Figure 3:
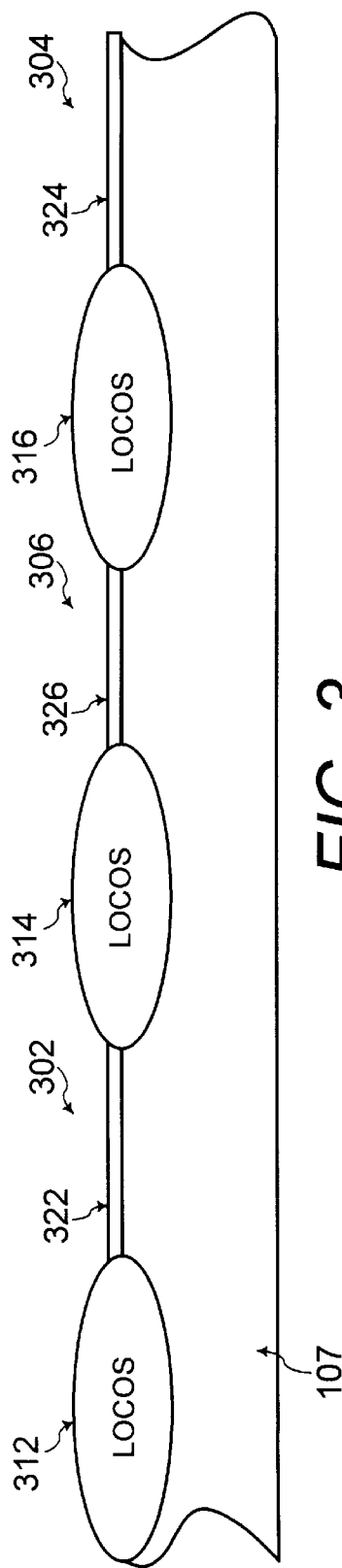
FIG. 3 shows a cross-section of three oxide regions separated by local oxidation.

Referring to FIG. 3, a cross section of the semiconductor wafer 107 across line B—B in FIG. 2 is shown. A first oxide region 302 is the gate terminal of the first MOSFET 102. The first MOSFET 102 is a high voltage MOSFET, and the oxide of the gate terminal of the first MOSFET 102 is relatively thicker. A second oxide region 304 is the gate terminal of a MOSFET 202 which is similar to the second MOSFET 104 of FIG. 2. That MOSFET 202 is a low voltage MOSFET, and the oxide of the gate terminal of that MOSFET 202 is relatively thinner. A third oxide region 306 is the gate terminal of another MOSFET 206 which is similar to the third MOSFET 106 of FIG. 2. That MOSFET 204 is a tunnel MOSFET, and the oxide of the gate terminal of that MOSFET 204 has a relatively intermediate thickness which is thinner than the oxide on the first oxide region 302 but thicker than the oxide on the second oxide region 304.

The first oxide region 302 is surrounded by a first LOCOS (Local Oxidation on Substrate) region 312 and a second LOCOS (Local Oxidation on Substrate) region 314. The second LOCOS region 314 separates the first oxide region 302 from the third oxide region 306. A third LOCOS (Local Oxidation on Substrate) region 316 separates the third oxide region 306 from the second oxide region 304.

A first sacrificial oxide layer 322 covers the first oxide region 302, a second sacrificial oxide layer 324 covers the second oxide region 304, and a third sacrificial oxide layer 326 covers the third oxide region 306. The sacrificial oxide layers 322, 324, and 326 buffer the impact of ion bombardment against the surface of the semiconductor substrate 107 during ion implantation to minimize damage to the semiconductor substrate 107.

Figure 4:
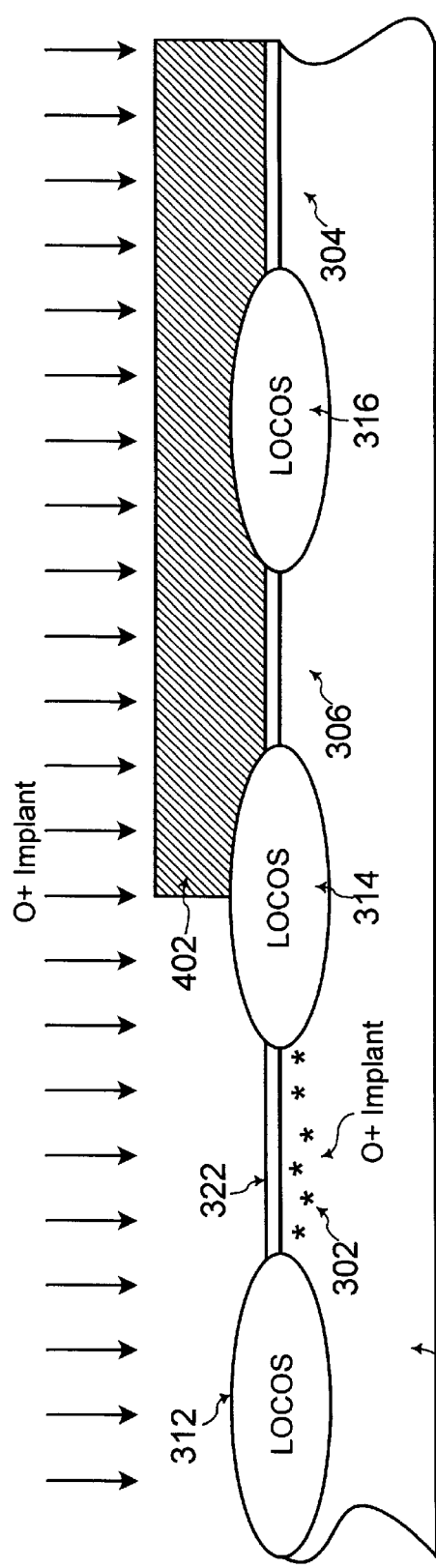
FIG. 4 shows the cross-section of FIG. 3 with a first masking layer such that one oxide region is exposed to oxygen ion implantation for thicker oxide growth, according to the present invention.

Referring to FIG. 4, a first masking layer 402 is deposited on the semiconductor wafer 107. The first masking layer 402 may be comprised of a photoresist material as known to one of ordinary skill in the art of integrated circuit fabrication. The first masking layer 402 defines at least one first region that is exposed for oxygen ion implantation. In FIG. 4, the first oxide region 302 is part of the at least one first region that is exposed for oxygen ion implantation. In regions where the first masking layer 402 is covering the semiconductor wafer 107, oxygen ions do not reach the surface of the semiconductor wafer 107.

Oxygen ions implanted into the semiconductor wafer 107 promote oxide growth during a thermal process for oxide growth as known to one of ordinary skill in the art. Thus, the at least one first region which is exposed to oxygen ion implantation is prepared to have a thickness of oxide which is relatively thicker because of the oxygen ion implantation. The first oxide region 302 which is the gate terminal of a high voltage MOSFET is included to have a thicker oxide grown thereon.

In addition, the dosage of the oxygen ion implantation may be varied to adjust the thickness of the oxide on the at least one first region. An increase of the dosage of oxygen ion implantation results in a larger thickness of the oxide grown on the at least one first region.

Figure 5:
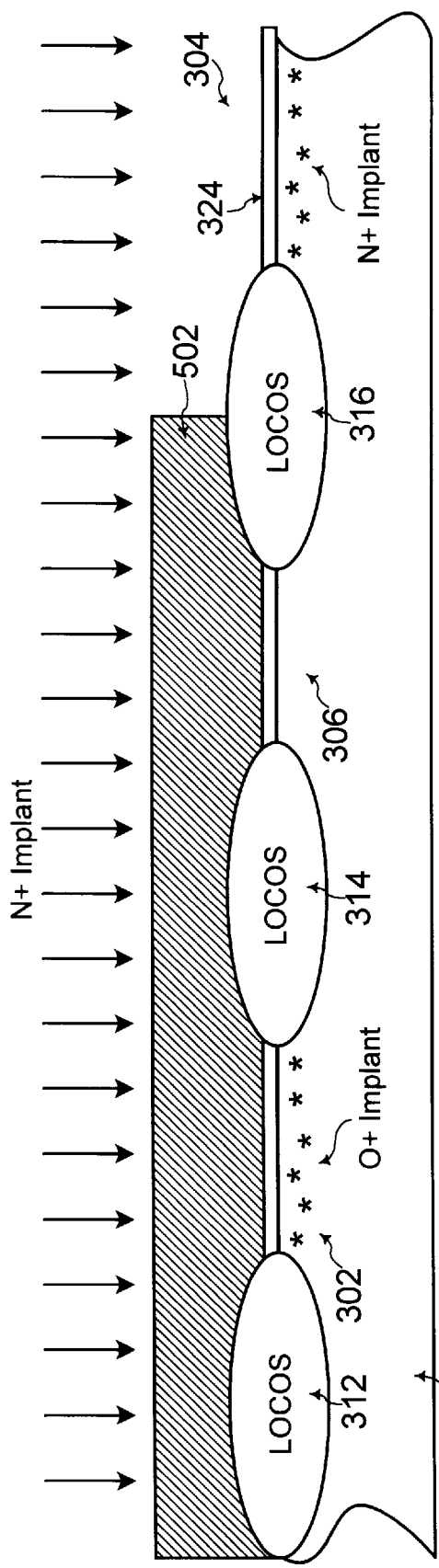
FIG. 5 shows the cross-section of FIG. 4 with a second masking layer such that another oxide region is exposed to nitrogen ion implantation for thinner oxide growth, according to the present invention.

Referring to FIG. 5, after the implantation of a desired dosage of oxygen ions, the first masking layer 402 is removed from the semiconductor wafer 107 using conventional photoresist stripping processes known to one of ordinary skill in the art of integrated circuit fabrication. Then, a second masking layer 502 is deposited on the semiconductor wafer 107. The second masking layer 502 may be comprised of a photoresist material as known to one of ordinary skill in the art of integrated circuit fabrication.

The second masking layer 502 defines at least one second region that is exposed for nitrogen ion implantation. In FIG. 5, the second oxide region 304 is part of the at least one second region that is exposed for nitrogen ion implantation. In regions where the second masking layer 502 is covering the semiconductor wafer 107, nitrogen ions do not reach the surface of the semiconductor wafer 107.

Nitrogen ions implanted into the semiconductor wafer 107 inhibits oxide growth during the thermal process for oxide growth as known to one of ordinary skill in the art. Thus, the at least one second region which is exposed to nitrogen ion implantation is prepared to have a thickness of oxide which is relatively thinner because of the nitrogen ion implantation. The second oxide region 304 which is the gate terminal of a low voltage MOSFET is included to have a thinner oxide grown thereon.

In addition, the dosage of the nitrogen ion implantation may be varied to adjust the thickness of the oxide on the at least one second region. An increase of the dosage of nitrogen ion implantation results in a smaller thickness of the oxide grown on the at least one second region.

Figure 6:
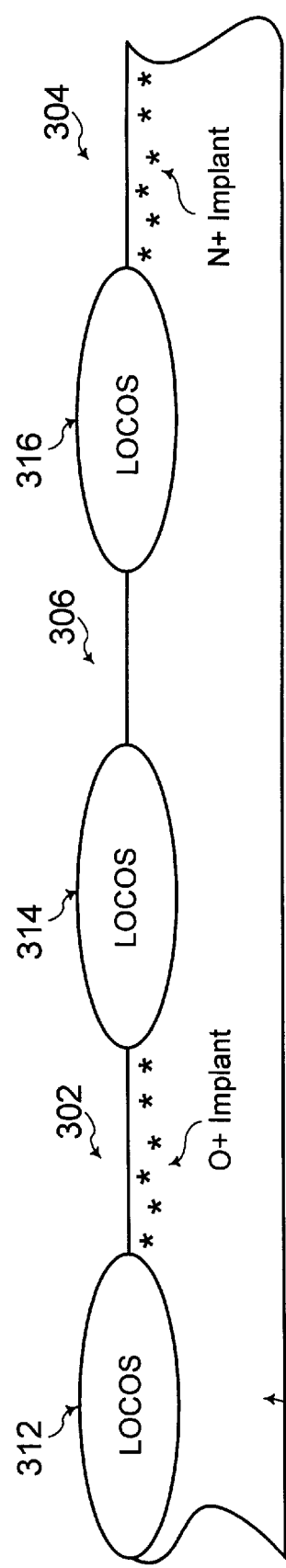
FIG. 6 shows the cross-section of FIG. 5 with the first masking layer of FIG. 4 and the second masking layer of FIG. 5 removed, according to the present invention.

Referring to FIG. 6, after the implantation of a desired dosage of nitrogen ions, the second masking layer 502 is removed from the semiconductor wafer 107 using conventional photoresist stripping processes known to one of ordinary skill in the art of integrated circuit fabrication. In addition, the first sacrificial oxide layer 322, the second sacrificial oxide layer 324, and the third sacrificial oxide layer 326 are etched off the surface of the semiconductor wafer 107. These sacrificial oxide layers buffered the impact of oxygen or nitrogen ions against the surface of the semiconductor wafer 107 to minimize structural damage to the surface of the semiconductor wafer 107 during implantation.

Figure 7:
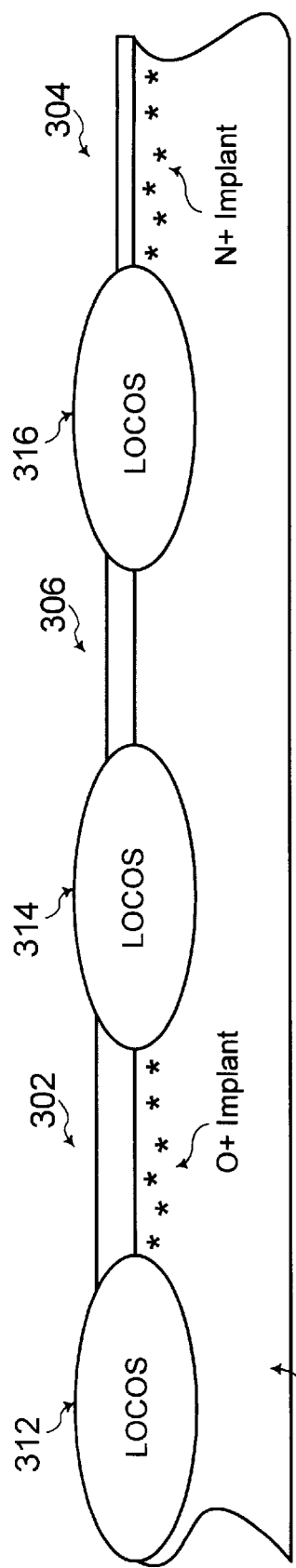
FIG. 7 shows the cross-section of FIG. 6 with oxide regions of various thicknesses grown after a thermal process, according to the present invention.

Referring to FIG. 7, with regions of the semiconductor wafer 107 having oxygen ion implantation and nitrogen ion implantation, a thermal process for the semiconductor wafer 107 results in growth of oxide on the semiconductor wafer 107. In FIG. 7, the at least one first region 302 which had oxygen ion implantation thereon has a relatively thicker oxide thickness than the other regions of the semiconductor wafer 107. The at least one second region 304 which had nitrogen ion implantation thereon has a relatively thinner oxide thickness than the other regions of the semiconductor wafer 107.

Referring to FIG. 7, at least one third region, including the third oxide region 306, is covered by the first masking layer 402 during oxygen ion implantation and by the second masking layer 502 during nitrogen ion implantation. Thus, the at least one third region is not implanted with oxygen ions nor with nitrogen ions. During the thermal process, the at least one third region has oxide grown thereon which has an intermediate thickness that is thinner than the oxide on the first oxide region 302 but that is thicker than the oxide on the second oxide region 304. The third oxide region 306 which is the gate terminal of a tunnel MOSFET is included as part of the at least one third region to have oxide of intermediate thickness grown thereon.

In this manner, the present invention exposes some regions of the semiconductor wafer 107 to oxygen ion implantation and exposes other regions of the semiconductor wafer 107 to nitrogen ion implantation. In addition, the present invention shields other regions of the semiconductor wafer 107 from oxygen or nitrogen ion implantation. Such treatment is performed on the semiconductor wafer 107 before any thermal process for oxide growth. After such treatment to the semiconductor wafer 107, a thermal process to the semiconductor wafer 107 results in oxide growth of a wider range of thicknesses than heretofore achievable with the prior art.

In addition, with the present invention, a wider range of thicknesses is achievable with a minimized number of thermal cycles because the thermal process for oxide growth is applied on the semiconductor wafer 107 once after the ion implantation treatments on the semiconductor wafer 107.

The foregoing is by way of example only and is not intended to be limiting. For example, although the present invention has been described to include oxygen ion implantation before nitrogen ion implantation, the present invention may be practiced with nitrogen ion implantation before oxygen ion implantation as would be apparent to one of ordinary skill in the art from the description herein.

Figure 8:
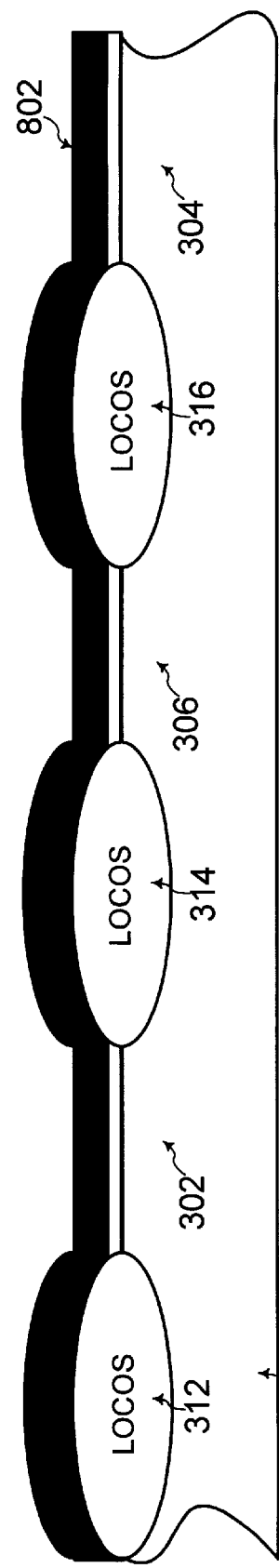
FIG. 8 shows the cross-section of FIG. 3 with a polysilicon layer on the semiconductor wafer.
Figure 9:
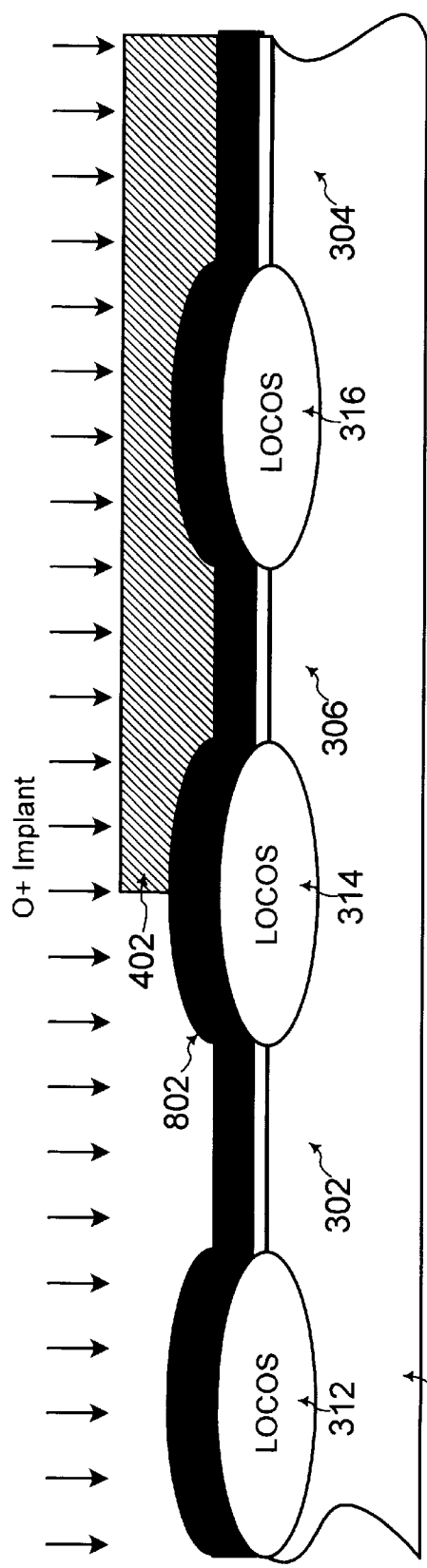
FIG. 9 shows the cross-section of FIG. 8 with a first masking layer such that one oxide region is exposed to oxygen ion implantation for thicker oxide growth, according to the present invention.
Figure 10:
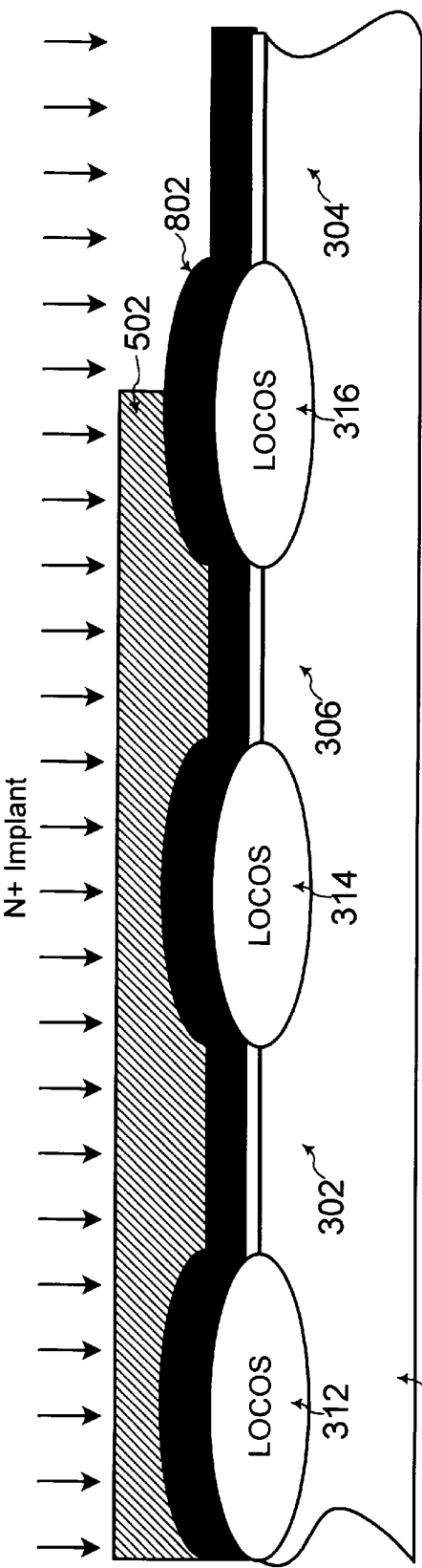
FIG. 10 shows the cross-section of FIG. 9 with a second masking layer such that another oxide region is exposed to nitrogen ion implantation for thinner oxide growth, according to the present invention.

The present invention may also be practiced for any type of structures or layers already present on the semiconductor wafer 107. Referring to FIG. 8, a polysilicon layer 802 covers the semiconductor wafer 107. Referring to FIG. 9, with the polysilicon layer 802 covering the semiconductor wafer 107, the first masking layer 402 is deposited to define the at least one first region that is exposed to oxygen ion implantation in a similar manner as described with respect to FIG. 4. Referring to FIG. 10, after oxygen ion implantation, the second masking layer 502 is deposited to define the at least one second region that is exposed to nitrogen ion implantation in a similar manner as described with respect to FIG. 5.

Figure 11:
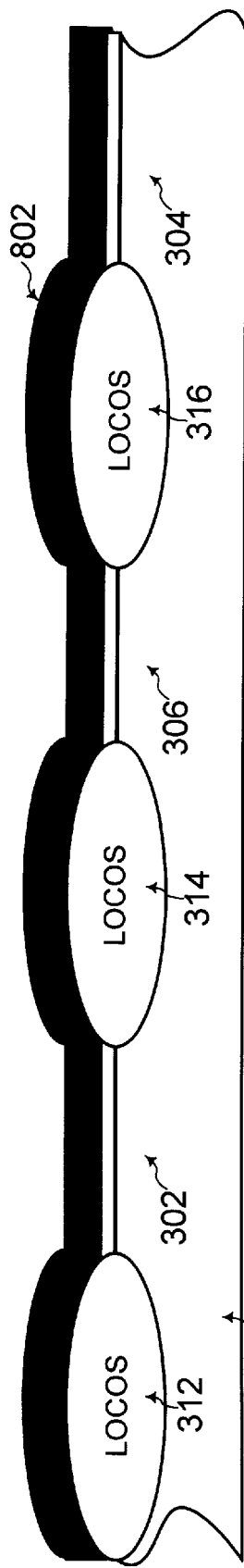
FIG. 11 shows the cross-section of FIG. 10 with the first masking layer of FIG. 9 and the second masking layer of FIG. 10 removed, according to the present invention.
Figure 12:
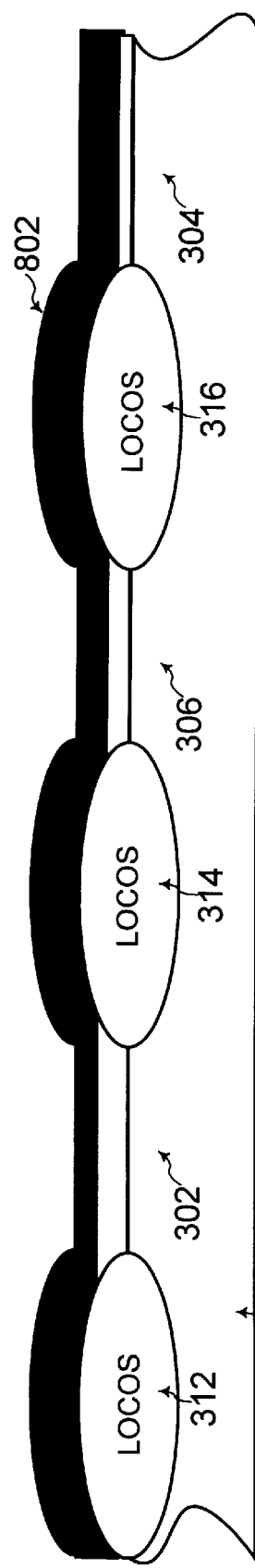
FIG. 12 shows the cross-section of FIG. 11 with oxide regions of various thicknesses grown after a thermal process, according to the present invention.

Referring to FIG. 11, after the oxygen and nitrogen implantation, the first masking layer 402 and the second masking layer 502 are removed from the semiconductor wafer 107. A thermal process is then applied on the semiconductor wafer for further oxide growth. Referring to FIG. 12, the first oxide region 302 which was part of the at least one first region exposed to the oxygen ion implantation has a relatively larger thickness. The second oxide region 304 which was part of the at least second region exposed to the nitrogen ion implantation has a relatively thinner thickness. The third oxide region 306 which was not exposed to the oxygen ion implantation nor to the nitrogen ion implantation has a relatively intermediate thickness.

Referring to FIG. 13, a semiconductor wafer 107 has structures for shallow trench isolation technology. An epitaxial layer 902 is deposited on the semiconductor wafer 107. The first oxide region 302, the second oxide region 304, and the third oxide region 306 are within the epitaxial layer 902. A first trench field oxide 904 separates the first oxide region 302 from the second oxide region 306, and a second trench field oxide 906 separates the third oxide region 306 from the second oxide region 304.

Referring to FIG. 13, the first masking layer 402 is deposited to define the at least one first region that is exposed to oxygen ion implantation in a similar manner as described with respect to FIG. 4. Referring to FIG. 14, after oxygen ion implantation, the second masking layer 502 is deposited to define the at least one second region that is exposed to nitrogen ion implantation in a similar manner as described with respect to FIG. 5.

Figure 15:
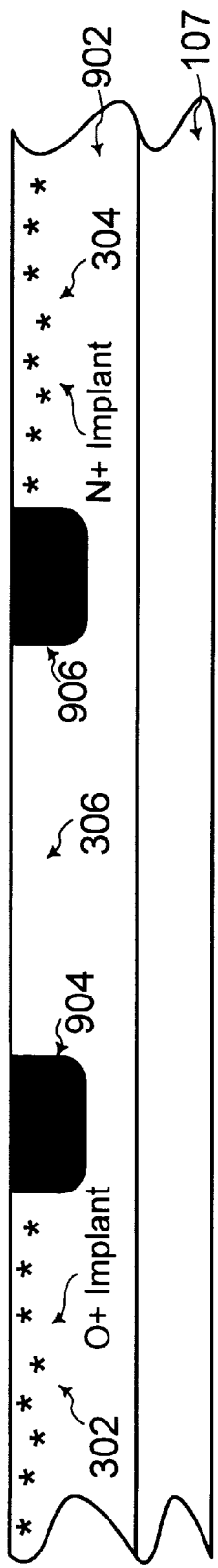
FIG. 15 shows the cross-section of FIG. 14 with the first masking layer of FIG. 13 and the second masking layer of FIG. 14 removed, according to the present invention.
Figure 16:
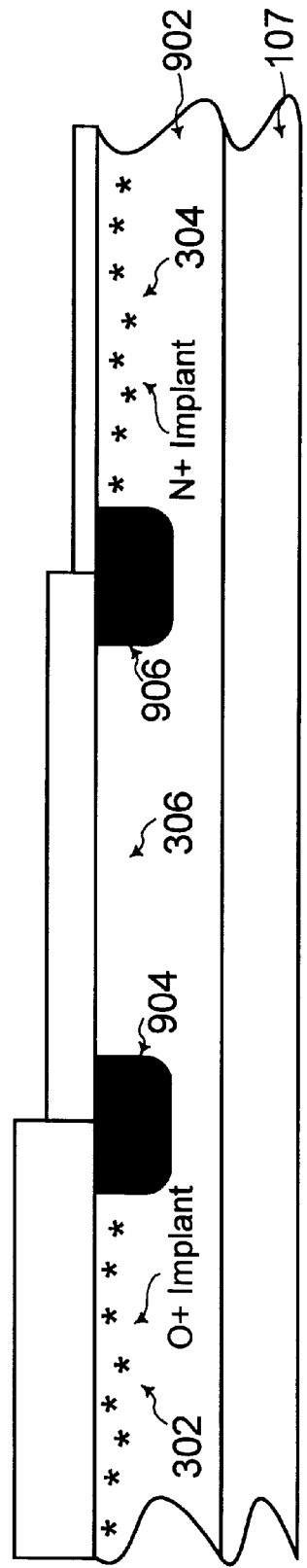
FIG. 16 shows the cross-section of FIG. 15 with oxide regions of various thicknesses grown after a thermal process, according to the present invention.

Referring to FIG. 15, after the oxygen and nitrogen implantation, the first masking layer 402 and the second masking layer 502 are removed. In addition, any sacrificial oxide layer on the first oxide region 302, the second oxide region 304, and the third oxide region 306 is also removed. A thermal process is then applied on the semiconductor wafer for further oxide growth. Referring to FIG. 16, the first oxide region 302 which was part of the at least one first region exposed to the oxygen ion implantation has a relatively larger thickness. The second oxide region 304 which was part of the at least second region exposed to the nitrogen ion implantation has a relatively thinner thickness. The third oxide region 306 which was not exposed to the oxygen ion implantation nor to the nitrogen ion implantation has a relatively intermediate thickness.

The embodiments of the present invention shown in FIGS. 8, 9, 10, 11, and 12 with the polysilicon layer 802 on the semiconductor wafer 107 and in FIGS. 13, 14, 15, and 16 with shallow trench isolation technology illustrate that the present invention may be applied to a semiconductor wafer having a variety of structures thereon.

The invention is limited only as defined in the following claims and equivalents thereof.

I claim:

1. A method for fabricating a plurality of oxide regions having a plurality of thicknesses on a semiconductor wafer, the method including the steps of:

A. depositing a first masking layer on said semiconductor wafer, said first masking layer defining at least one first region for oxide growth of a first thickness;

B. implanting oxygen ions into said at least one first region such that said first thickness of oxide on said at least one first region is relatively thicker;

C. removing said first masking layer from said semiconductor wafer;

D. depositing a second masking layer on said semiconductor wafer, said second masking layer defining at least one second region for oxide growth of a second thickness;

E. implanting nitrogen ions into said at least one second region such that said second thickness of oxide on said at least one second region is relatively thinner;

F. removing said second masking layer from said semiconductor wafer; and

G. growing oxide on said at least one first region to have said first thickness and on said at least one second region to have said second thickness with a thermal process for said semiconductor wafer.

2. The method of claim 1, wherein said oxide on said at least one first region having said first thickness is fabricated as part of a high voltage transistor on said semiconductor wafer.

3. The method of claim 1, wherein said oxide on said at least one second region having said second thickness is fabricated as part of a low voltage transistor on said semiconductor wafer.

4. The method of claim 1, wherein said first thickness of said oxide on said at least one first region is less than 200 Å (angstroms).

5. The method of claim 1, wherein said second thickness of said oxide on said at least one second region is less than 30 Å (angstroms).

6. The method of claim 1, further including the step of:

growing oxide on at least one third region having a third thickness on said semiconductor wafer during said thermal process, said at least one third region not having been implanted with oxygen ions and not having been implanted with nitrogen ions, and said third thickness of said oxide on said at least one third region being relatively less than said first thickness and relatively greater than said second thickness.

7. The method of claim 6, wherein said oxide on said at least one third region having said third thickness is fabricated as part of a tunnel transistor on said semiconductor wafer.

8. The method of claim 6, wherein said third thickness of said oxide on said at least one third region is less than 150 Å (angstroms).

9. The method of claim 1, wherein step B further includes the step of:

varying a dosage of oxygen ion implantation to adjust said first thickness of said oxide on said at least one first region, wherein an increase of said dosage of oxygen ion implantation results in a larger first thickness of said oxide on said at least one first region.

10. The method of claim 1, wherein step E further includes the step of:
   varying a dosage of nitrogen ion implantation to adjust said second thickness of said oxide on said at least one second region, wherein an increase of said dosage of nitrogen ion implantation results in a smaller second thickness of said oxide on said at least one second region.

11. The method of claim 1, wherein said at least one first region and said at least one second region are below a poly-Silicon layer.

12. A method for fabricating a plurality of oxide regions having a plurality of thicknesses on a semiconductor wafer, the method including the steps of:
   A. depositing a first masking layer on said semiconductor wafer, said first masking layer defining at least one first region for oxide growth of a first thickness;
   B. implanting oxygen ions into said at least one first region such that said first thickness of oxide on said at least one first region is relatively thicker, wherein said oxide on said at least one first region having said first thickness is fabricated as part of a high voltage transistor on said semiconductor wafer, and wherein said first thickness of said oxide on said at least one first region is less than 200 Å (angstroms), and wherein said step B further includes the step of:
      varying a dosage of oxygen ion implantation to adjust said first thickness of said oxide on said at least one first region, wherein an increase of said dosage of oxygen ion implantation results in a larger first thickness of said oxide on said at least one first region;
   C. removing said first masking layer from said semiconductor wafer;
   D. depositing a second masking layer on said semiconductor wafer, said second masking layer defining at least one second region for oxide growth of a second thickness;
   E. implanting nitrogen ions into said at least one second region such that said second thickness of oxide on said at least one second region is relatively thinner, wherein said oxide on said at least one second region having said second thickness is fabricated as part of a low voltage transistor on said semiconductor wafer, and wherein said second thickness of said oxide on said at least one second region is less than 30 Å (angstroms), wherein said step E further includes the step of:
      varying a dosage of nitrogen ion implantation to adjust said second thickness of said oxide on said at least one second region, wherein an increase of said dosage of nitrogen ion implantation results in a smaller second thickness of said oxide on said at least one second region;
   F. removing said second masking layer from said semiconductor wafer;
   G. growing oxide on said at least one first region to have said first thickness and on said at least one second region to have said second thickness with a thermal process for said semiconductor wafer; and
   H. growing oxide on at least one third region having a third thickness on said semiconductor wafer during said thermal process, said at least one third region not having been implanted with oxygen ions and not having been implanted with nitrogen ions, and said third thickness of said oxide on said at least one third region being relatively less than said first thickness and relatively greater than said second thickness, wherein said oxide on said at least one third region having said third thickness is fabricated as part of a tunnel transistor on said semiconductor wafer, and wherein said third thickness of said oxide on said at least one third region is less than 150 Å (angstroms).

* * * * *